United States Patent
Lim

(10) Patent No.: US 8,493,706 B2
(45) Date of Patent: Jul. 23, 2013

(54) SEMICONDUCTOR MODULE AND DATA MEMORY MODULE HAVING THE SAME

(75) Inventor: Gwang-Man Lim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 399 days.

(21) Appl. No.: 12/776,882

(22) Filed: May 10, 2010

(65) Prior Publication Data

US 2010/0302829 A1   Dec. 2, 2010

(30) Foreign Application Priority Data

Jun. 1, 2009   (KR) ........................ 10-2009-0048246

(51) Int. Cl.
*H02H 1/00* (2006.01)
*H02H 1/04* (2006.01)
*H02H 3/22* (2006.01)
*H02H 9/06* (2006.01)
*H02H 9/00* (2006.01)

(52) U.S. Cl.
USPC ............................................ 361/117; 361/56

(58) Field of Classification Search
USPC .......................................................... 361/117
See application file for complete search history.

(56) References Cited

U.S. PATENT DOCUMENTS 7,267,287 B2 * 9/2007 Nishizawa et al. ........... 235/492
7,606,046 B2 * 10/2009 Han et al. ...................... 361/760

FOREIGN PATENT DOCUMENTS

| JP | 2006-164302 A | 6/2006 |
| KR | 10-2005-0086017 A | 8/2005 |
| KR | 10-2008-0004326 A | 1/2008 |

* cited by examiner

*Primary Examiner* — Dharti Patel
(74) *Attorney, Agent, or Firm* — Sughrue Mion, PLLC

(57) ABSTRACT

A semiconductor module and a data memory module having the same are provided. The semiconductor module includes a substrate having a semiconductor device, a ground terminal, a protection pattern, and a switching element. The ground terminal and the protection pattern are formed on the substrate. The switching element connects the ground terminal and the protection pattern in series. The switching element electrically connects the protection pattern and the ground terminal when a voltage applied to the substrate is beyond a set voltage range.

12 Claims, 16 Drawing Sheets

SEMICONDUCTOR MODULE AND DATA MEMORY MODULE HAVING THE SAME

PRIORITY STATEMENT

This application claims priority under 35 U.S.C. §119 from Korean Patent Application No. 10-2009-0048246, filed on Jun. 1, 2009, the contents of which are hereby incorporated herein by reference in its entirety.

SUMMARY

Illustrative embodiments relate to a semiconductor module and a data memory module having the same, and more particularly, to a semiconductor module that protects a semiconductor device from electrostatic discharge (ESD).

Semiconductor devices malfunction, become inoperative or burn out as a result of a momentary high voltage applied to the semiconductor devices when exposed to a high electric field. This phenomenon is called electrostatic discharge (ESD). To protect semiconductor devices from ESD, semiconductor devices include a protection pattern. Nevertheless, even with the protection pattern, semiconductor devices continue to suffer from damages resulting from ESD.

Illustrative embodiments provide a semiconductor module capable of effectively protecting a semiconductor device from ESD.

Illustrative embodiments also provide a data memory module including a semiconductor module capable of effectively protecting a semiconductor device from ESD.

The semiconductor module includes a first substrate on which a first semiconductor device is mounted. A ground terminal is formed on the first substrate. A first protection pattern is formed on the first substrate. A switching element connects the ground terminal and the first protection pattern in series. The switching element electrically connects the first protection pattern and the ground terminal when a voltage applied to the-first substrate is beyond a set voltage range.

In this illustrative embodiment, two ground terminals may be provided on one side of the first substrate, and two switching elements may be formed adjacent to the ground terminals. The first protection pattern may be configured such that opposite ends thereof are connected through the switching elements to the ground terminals, and may be formed along an edge of the first substrate.

The switching element may include one of a variable resistor (varistor), a Zener diode and an inductor.

The switching element may electrically disconnect the first protection pattern from the ground terminal when the voltage applied to the first substrate is within a set voltage range.

In further illustrative embodiments, the semiconductor module may further include a second substrate located under the first substrate and having a second semiconductor device, a second protection pattern formed on the second substrate, and a via pattern electrically connecting the second protection pattern with the first protection pattern.

In other illustrative embodiments, the semiconductor module may further include an external connection terminal formed on the first substrate, a connection pattern electrically connecting the external connection terminal with the first semiconductor device, and a varistor connecting the connection pattern with the ground terminal. The varistor may electrically connect the connection pattern with the ground terminal when a voltage applied to the first substrate is beyond a set voltage range.

Other illustrative embodiments are directed to a data memory module. The data memory module includes a substrate on which a memory chip is mounted. A ground terminal is formed on the substrate. In addition, a protection pattern is formed on the substrate. A switching element connects the protection pattern and the ground terminal in series. The switching element electrically connects the protection pattern with the ground terminal when a voltage applied to the substrate is beyond a set voltage range.

The switching element may include one of a varistor, a Zener diode and an inductor.

The data memory module may further include an external connection terminal formed on the substrate, an interface electrically connected with the external connection terminal and transceiving data, a controller electrically connecting a memory chip with the interface, and a buffer memory being electrically connected with the controller and temporarily storing the data.

BRIEF DESCRIPTION OF THE DRAWINGS

Illustrative embodiments are described in further detail below with reference to the accompanying drawings. It should be understood that various aspects of the drawings may have been exaggerated for clarity.

DETAILED DESCRIPTION

Figure 1A:
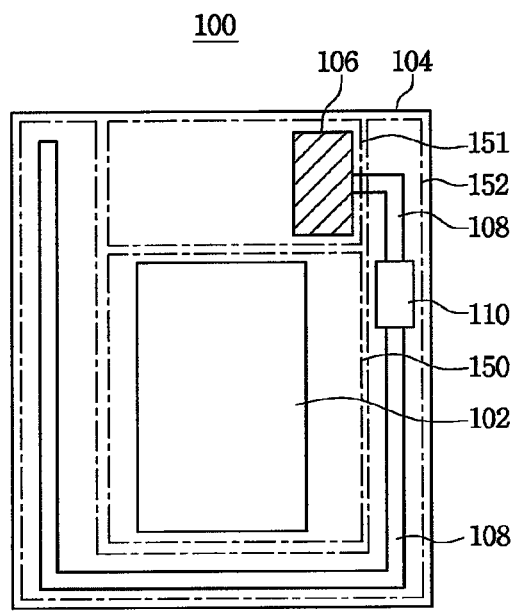
FIG. 1A is a plan view of a semiconductor module according to a first illustrative embodiment.

Various illustrative embodiments will now be described more fully with reference to the accompanying drawings in which some illustrative embodiments are shown. In the drawings, the thicknesses of layers and regions may be exaggerated for clarity. Detailed illustrative embodiments are disclosed herein. However, specific structural and functional details disclosed herein are merely representative for purposes of describing illustrative embodiments. Illustrative embodiments may have many alternate forms and the illustrative embodiments set forth herein should not be construed as limiting.

Accordingly, while embodiments are capable of various modifications and alternative forms, illustrative embodiments thereof are shown by way of example in the drawings and will herein be described in detail. It should be understood, however, that there is no intent to limit illustrative embodiments to the particular forms disclosed, but on the contrary, illustrative embodiments are to cover all modifications, equivalents, and alternatives falling within the scope of the inventive concept, as defined by the appended claims. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the illustrative embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. By contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting to the illustrative embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof. Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if a device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Illustrative embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, illustrative embodiments should not be construed as limiting to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature. Their shapes do not necessarily illustrate the actual shape of a region of a device and should not be construed as limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe illustrative embodiments, various aspects will be described in detail with reference to the attached drawings. However, the inventive concept defined by the appended claims is not limited to illustrative embodiments described.

First Illustrative Embodiment

Figure 1B:
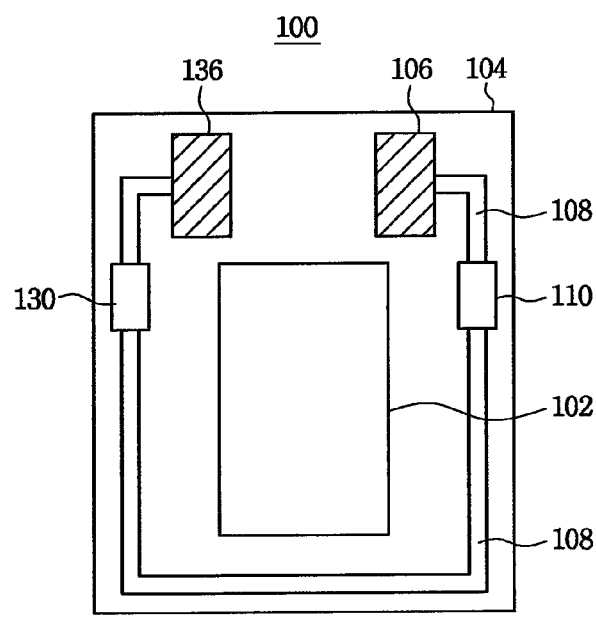
FIG. 1B is a plan view of a semiconductor module employing two ground terminals and two switching elements according to an aspect of the first illustrative embodiment.
Figure 1C:
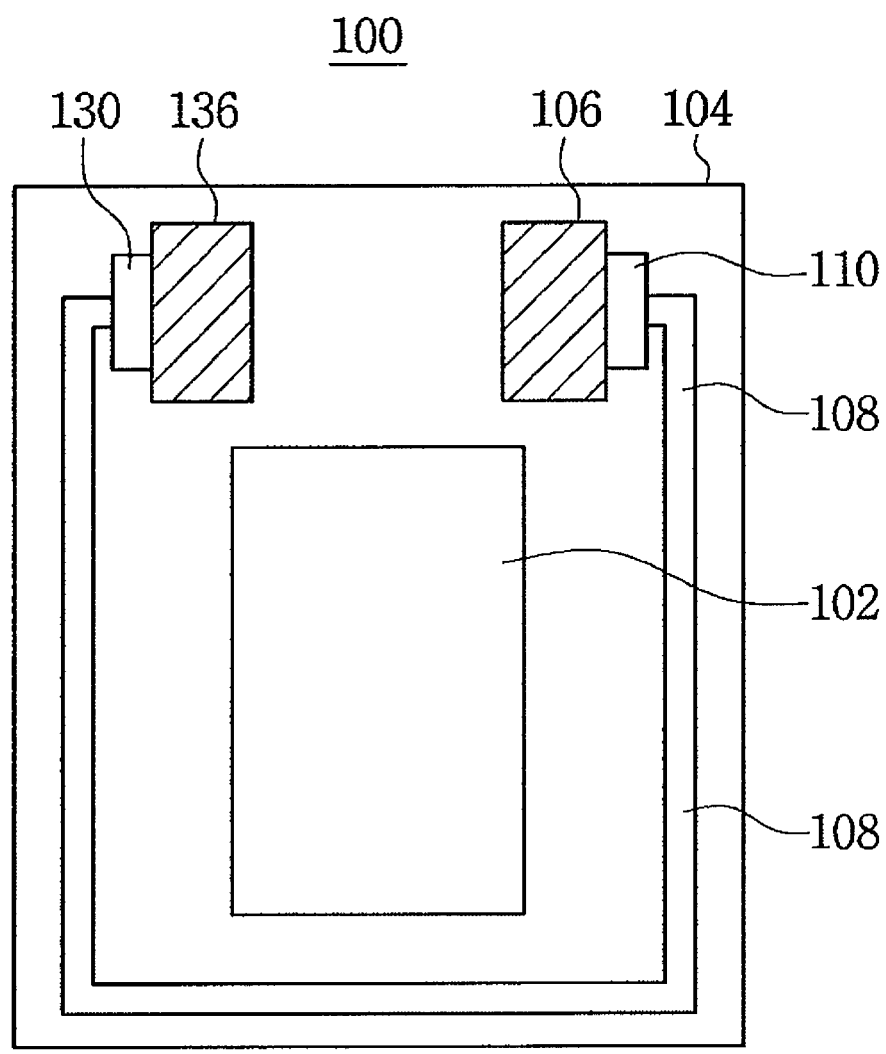
FIG. 1C is a plan view of a semiconductor module employing two switching elements formed adjacent to the ground terminals according to another aspect of the first illustrative embodiment.
Figure 2:
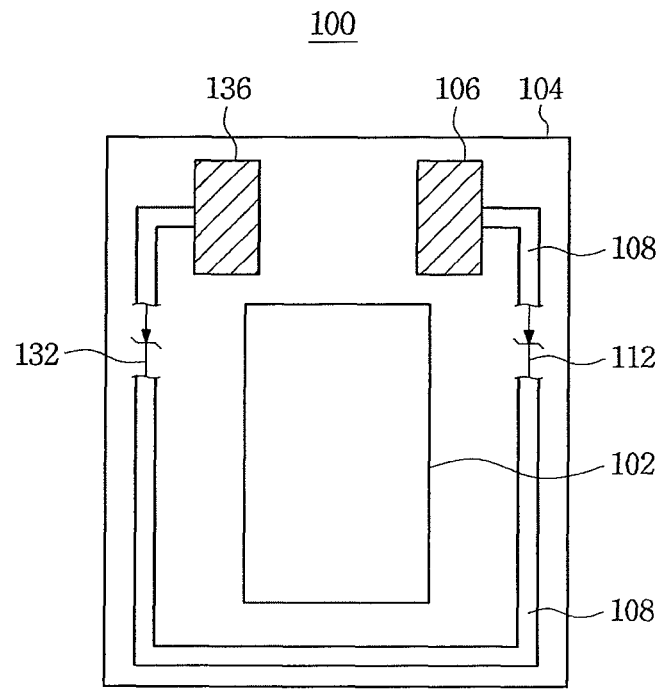
FIG. 2 is a plan view of a semiconductor module employing Zener diodes, which serve as switching elements as shown in FIG. 1B.
Figure 3:
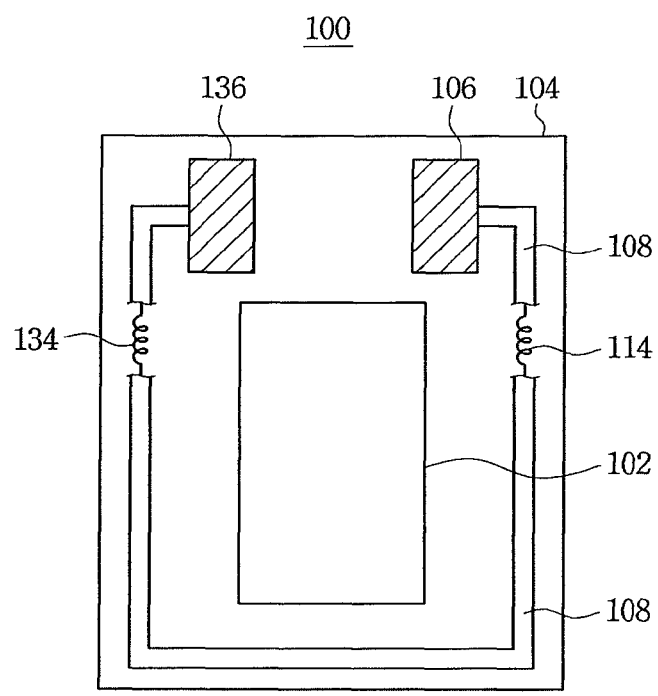
FIG. 3 is a plan view of a semiconductor module employing inductors, which serve as switching elements as shown in FIG. 1B.
Figure 4:
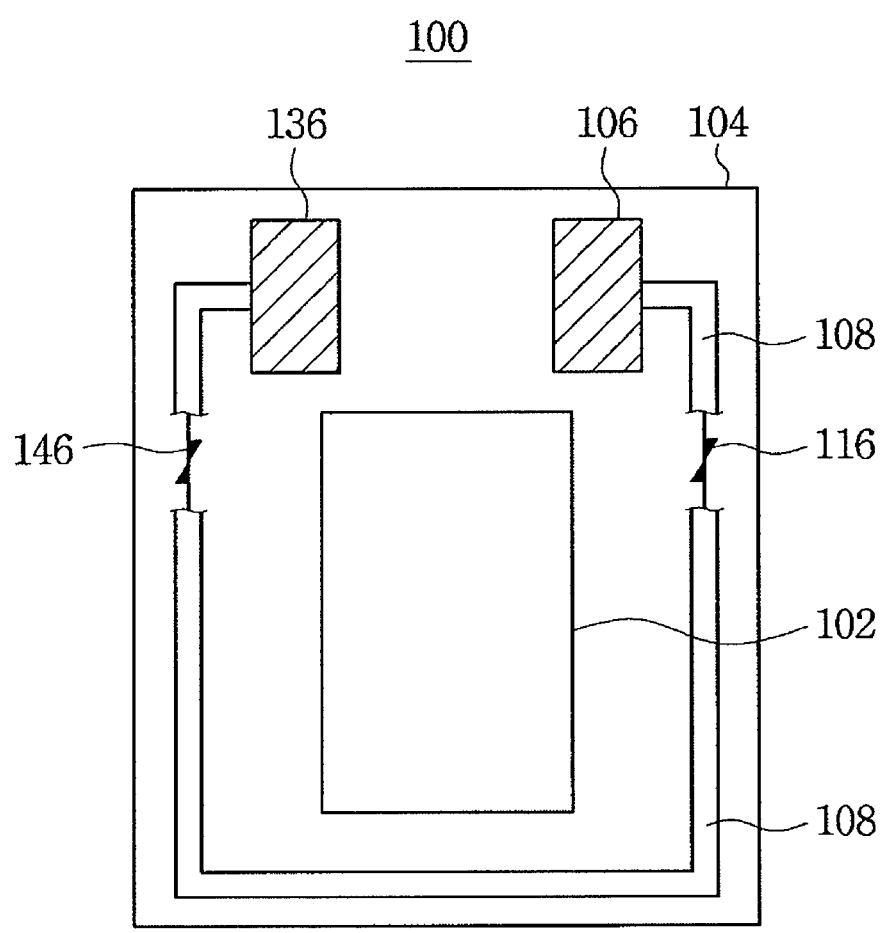
FIG. 4 is a plan view of a semiconductor module employing varistors, which serve as switching elements as shown in FIG. 1B.
Figure 5:
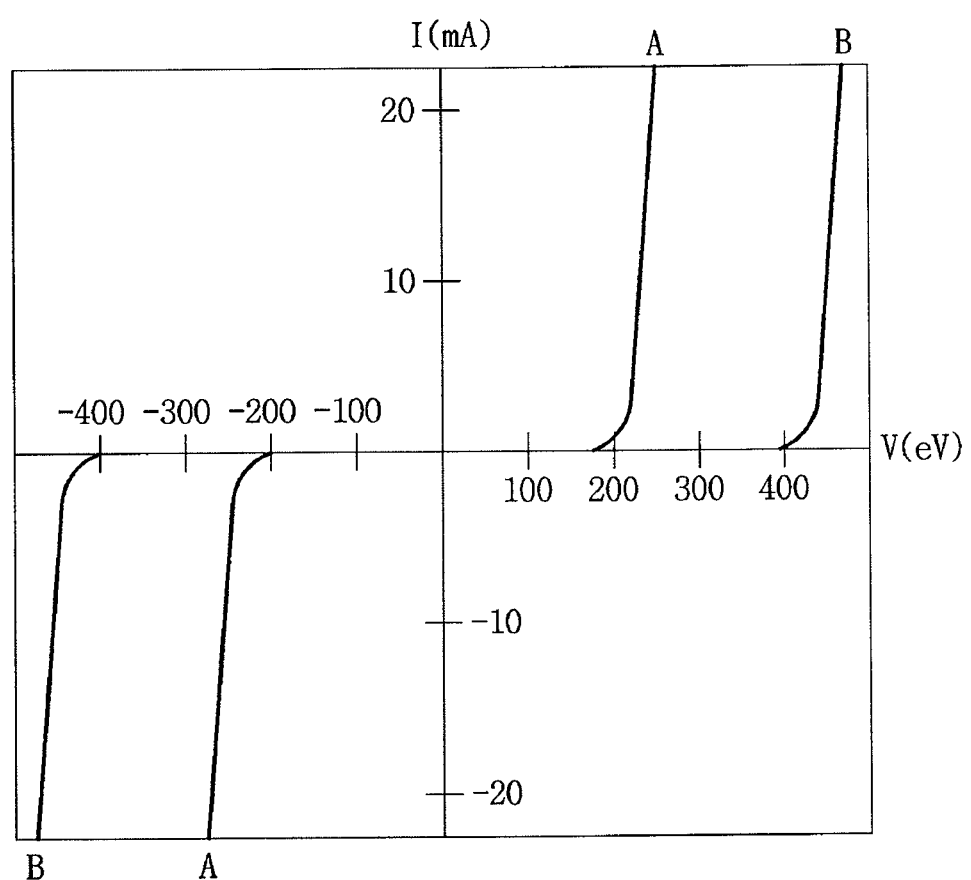
FIG. 5 is a graph illustrating a current-voltage (I-V) characteristic of the varistors as shown in FIG. 4.
Figure 6:
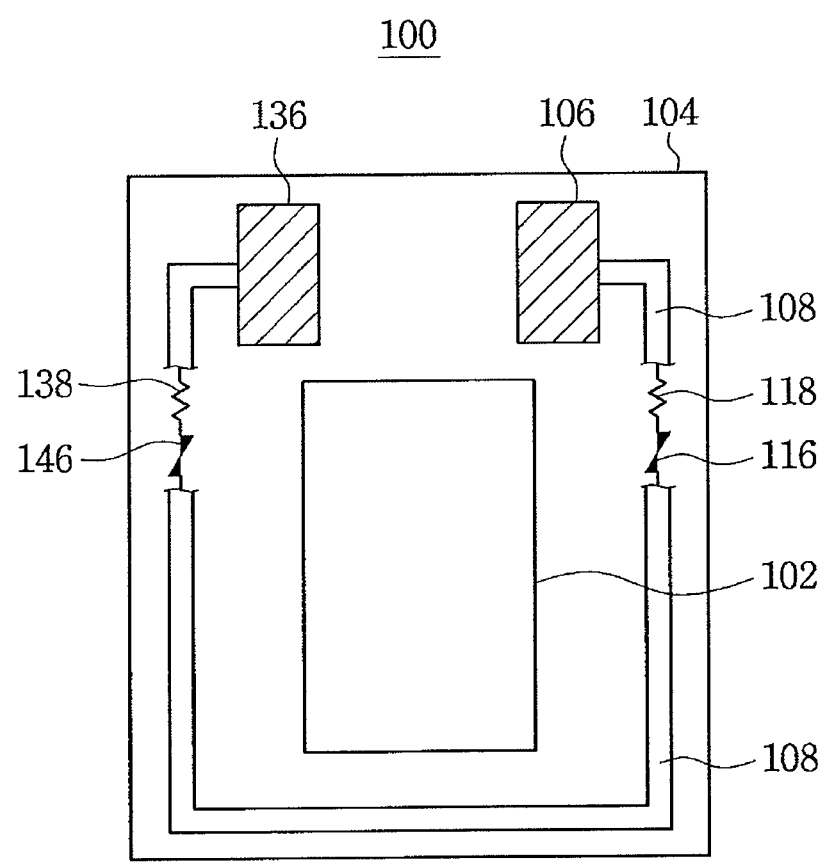
FIG. 6 is a plan view of a semiconductor module employing resistors and varistors, which serve as switching elements as shown in FIG. 1B.

FIG. 1A is a plan view of a semiconductor module according to a first illustrative embodiment. FIG. 1B is a plan view of a semiconductor module employing two ground terminals and two switching elements according to an aspect of the first illustrative embodiment. FIG. 1C is a plan view of a semiconductor module employing two switching elements each of which is formed adjacent to the corresponding ground terminal according to another aspect of the first illustrative embodiment. FIG. 2 is a plan view of a semiconductor module employing Zener diodes, which serve as switching elements as shown in FIG. 1B. FIG. 3 is a plan view of a semiconductor module employing inductors, which serve as switching elements as shown in FIG. 1B. FIG. 4 is a plan view of a semiconductor module employing varistors, which serve as switching elements as shown in FIG. 1B. FIG. 5 is a graph illustrating a current-voltage (I-V) characteristic of the varistors as shown in FIG. 4. FIG. 6 is a plan view of a semiconductor module employing resistors and varistors, which serve as switching elements as shown in FIG. 1B.

Referring to FIG. 1A, the semiconductor module 100 includes a substrate 104 on which a semiconductor device 102 is formed, a ground terminal 106, a protection pattern 108, and a switching element 110.

The substrate 104 may include a printed circuit board or a flexible printed circuit board. Further, the substrate 104 may have a single layer structure or a multilayer structure.

The substrate 104 may be divided into a first, a second and a third region. The first region 150 refers to a region in which the semiconductor device 102 is mounted. The second region 151 refers to a region in which the ground terminal 106 is installed. The third region 152 refers to a region in which the protection pattern 108, which is configured to protect the semiconductor device 102, is installed. For example, the first region 150 may be a central region of the substrate 104, and the second region 151 may be a region on one side of the central region. Finally, the third region 152 may be a region around the first region except the second region.

The semiconductor device 102 may include a memory chip. The memory chip may include a volatile memory chip or a non-volatile memory chip. For example, the volatile memory chip may be a dynamic random access memory (DRAM) or a static random access memory (SRAM). The non-volatile memory chip may be, for example, a NAND flash memory or a NOR flash memory. The NAND flash memory may have a single level cell (SLC) structure or a multi level cell (MLC) structure. An MLC NAND flash memory may store data with a higher capacity compared to an SLC NAND flash memory of the same size.

The ground terminal 106 is connected to an external ground at one end thereof, and to the protection pattern 108 at the other end thereof. The ground terminal 106 may be directly connected to the ground or to the protection pattern 108. The ground terminal 106 may also be indirectly connected to the ground or the protection pattern 108 by a conductive pattern.

According to this illustrative embodiment, two ground terminals 106 and 136 may be formed, as shown in FIG. 1B. The opposite ends of the protection pattern 108 may be connected with the respective ground terminals 106 and 136. Although this illustrative embodiment uses the two ground terminals 106 and 136, the number of the ground terminals is not limited to two.

The ground terminals 106 may be formed of a conductor. The conductor may include a metal or a metallic compound. The conductor may be of copper or of a copper compound, for example.

The protection pattern 108 is formed in the second region of the substrate 104, and is spaced apart from the semiconductor device 102 by a predetermined distance. Further, the protection pattern 108 is connected to the ground terminals 106 and 136. In this illustrative embodiment, when the number of the ground terminals is two, the opposite ends of the protection pattern 108 may be connected with the respective ground terminals 106 and 136, and thus the protection pattern 108 may have the shape of a loop that surrounds the semiconductor device 102.

The protection pattern 108 may be formed of a conductor. The conductor may include a metal or a metallic compound. The conductor may be of copper or of a copper compound, for example.

The switching element 110 connects the ground terminal 106 and the protection pattern 108 in series. According to this illustrative embodiment, the switching element 110 may be installed in the protection pattern 108. The switching element 110 may also be directly connected with the ground terminal 106.

In this illustrative embodiment, two switching elements 110 and 130 may be formed. The switching elements 110 and 130 connect the ground terminals 106 and 136 to the opposite ends of the protection pattern 108, respectively. Although this illustrative embodiment uses the two switching elements 110 and 130, the number of the switching elements is not limited to two.

Further, the switching elements 110 and 130 may be formed adjacent to the ground terminals 106 and 136, as shown in FIG. 1C. This configuration allows a distance between the switching elements 110 and 136 and the ground terminals 106 and 136, respectively, to be minimized. Thereby, when a spark is triggered under high voltage, as in an electrostatic discharge (ESD), a high-voltage current may rapidly flow to the ground terminals 106 and 136 through the protection pattern 108.

The switching elements 110 and 136 may include one of a Zener diode, an inductor, and a varistor.

Referring to FIG. 2, the switching elements 110 and 130 are formed of a Zener diodes 112 and 132. A Zener diode is also called a constant voltage diode because the Zener diode shows a characteristic in which a current is sharply increased at a specific voltage, and then the voltage is maintained at an almost constant value. As such, the Zener diodes 112 and 132 are used as voltage reference devices.

Referring to FIG. 3, the switching elements 110 and 130 are formed of inductors 114 and 134. The inductors 114 and 134 include windings having several spiral turns, and may inhibit a sharp change in a voltage in proportion with a variation in a current by inducing a voltage in inductors 114 and 134.

Referring to FIG. 4, the switching elements 110 and 130 are formed of varistors 116 and 146. Varistors 116 and 146 are circuit protection devices which have a non-linear characteristic of a resistance. The resistance is high when an applied voltage is within a set voltage range, and the resistance is low when an applied voltage is beyond the set voltage range. The varistors 116 and 146 are used to absorb and dissipate a sharp increase in an external voltage. Varistors 116 and 146 are divided into symmetrical types and asymmetrical types. In a symmetrical varistor, a resistance is varied by the intensity of an applied voltage regardless of a polarity of the applied voltage. In an asymmetrical varistor, a resistance is varied by the polarity of an applied voltage.

Particularly, in this illustrative embodiment, varistors 116 and 146 are formed of laminated varistors using semiconductor ceramic.

Varistors 116 and 146 may include a side electrode, an interlayer electrode, and a semiconductor ceramic.

The side electrode may have a pair opposite to each other, and may be formed of a conductor. The conductor may include a metal or a metallic compound, for instance copper or a copper compound.

The interlayer electrode may be electrically connected with the side electrode, and may extend perpendicular to a direction where the side electrode extends. There may be a plurality of interlayer electrodes. These interlayer electrodes may be placed in parallel to each other. Further, the interlayer electrodes may be electrically connected to one side of the side electrode in an alternate illustrative embodiment.

The interlayer electrode may be formed of a conductor. The conductor may include a metal or a metallic compound, for instance copper or a copper compound. The interlayer electrode may be formed of substantially the same material as the side electrode or of a material different from the material of the side electrode.

The semiconductor ceramic may be configured to bury the side and interlayer electrodes. The semiconductor ceramic may be formed of metal oxide or metal carbide. The metal oxide may be zinc oxide (ZnO), tin oxide ($SnO_2$), barium titanate ($BaTiO_3$), for example. The metal carbide may be silicon carbide (SiC), for example.

Referring to FIG. 5, the varistors 116 and 146 have a high value of resistance within a set voltage range, so that a value of a current thereof is substantially zero (0). By contrast, beyond the set voltage range, the varistors 116 and 146 have a low value of resistance, and thus a predetermined value of current.

For example, in the graph of FIG. 5, a varistor A has a set voltage range of about −200 V to +200 V. Within the set voltage range, varistor A has a high value of resistance, and thus a substantially zero value of a current. By contrast, beyond the set voltage range, varistor A has a low value of resistance, and thus a predetermined value of the current (i.e. the current which flows through varistor A).

Another varistor B has a set voltage range of about −400 V to +400 V. Similarly, within the set voltage range, varistor B has a substantially zero value of the current. By contrast, beyond the set voltage range, the varistor B has a predetermined value of current (i.e. the current flows to the varistor B).

Referring to FIG. 6, the varistors 116 and 146 are used as switching elements 110 and 130. Resistors 118 and 138 are inserted into the protection pattern 108 adjacent to varistors 116 and 146, respectively. Resistors 118 and 138 may have a high value of resistance.

According to an illustrative embodiment, resistors 118 and 138 may be installed between the ground terminals 106 and 136 and varistors 116 and 146. In detail, resistors 118 and 138 may be inserted into the protection pattern 108 between the ground terminals 106 and 136 and varistors 116 and 146. According to another illustrative embodiment, resistors 118 and 138 may be inserted into any other region of the protection pattern 108 between the ground terminals 106 and 136 and the varistors 116 and 146, and be connected with the protection pattern 108 in series.

Varistors 116 and 146 function as switching elements 110 130, and resistors 118 and 138 are installed adjacent to varistors 116 and 146, so that, when the voltage applied to the substrate 104 is beyond the set voltage range, resistors 118 and 138 can more effectively protect the semiconductor device 102 in cooperation with varistors 116 and 146.

The principle of operating the semiconductor module 100 depending on an applied voltage will be described below.

When a voltage is applied to the substrate 104 within a set voltage range, the switching elements 110 and 130 have a high value of resistance, and thus become substantially an off state. Thus, the protection pattern 108 and the ground terminals 106 and 136 are electrically disconnected, and the protection pattern 108 becomes an open circuit state.

The set voltage range may be an operating voltage range. In other words, products employing the semiconductor module 100 may have different set voltage ranges. For example, when the semiconductor module 100 is applied to a solid state drive (SSD), the set voltage range may range from −12 V to +12 V.

The protection pattern 108 becomes the open circuit state within the set voltage range, so that the protection pattern 108 may be less susceptible to a loop antenna effect caused by a loop shape. Since the loop antenna effect is inhibited, the protection pattern 108 may be less affected by electro magnetic interference (EMI). Further, since the protection pattern 108 becomes the open circuit state, a return path of a signal applied to the substrate 104 becomes short, so that it is possible to inhibit generation of noise resulting from a long return path.

When the voltage applied to the substrate 104 is beyond the set voltage range, the switching elements 110 and 130 have a very low value of resistance, and thus turn substantially to an ON state. The protection pattern 108 is electrically connected with the ground terminals 106 and 136, and thus become a short circuit state. In other words, the protection pattern 108 is electrically connected with the ground terminals 106 and 136 by the switching elements 110 and 130.

When the voltage is beyond the set voltage range, it may be the case that a high voltage is applied from the outside as in the ESD. In this case, the protection pattern 108 may be electrically connected with the ground terminals 106 and 136, so that a current related to the high voltage can flow to the ground through the ground terminals 106 and 136. Thus, the semiconductor device 102 may be protected from the ESD.

Second Illustrative Embodiment

Figure 7A:
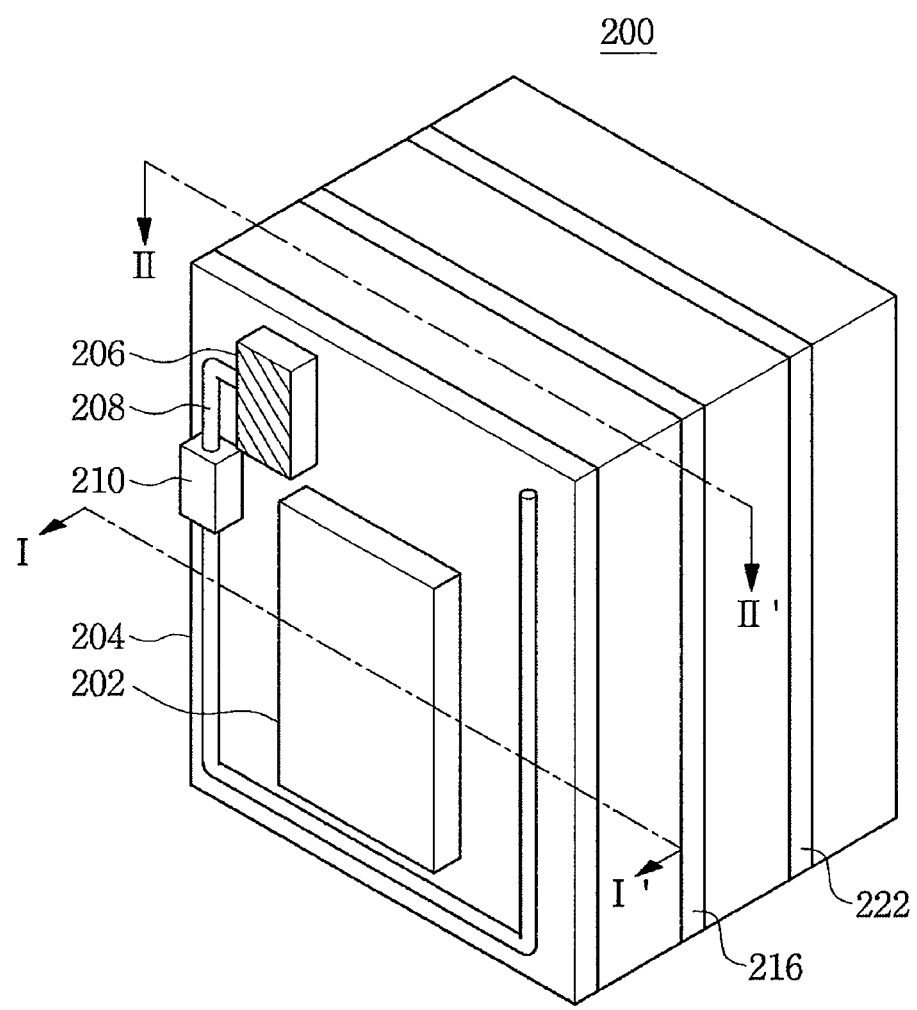
FIG. 7A is a plan view of a semiconductor module according to a second illustrative embodiment.
Figure 7B:
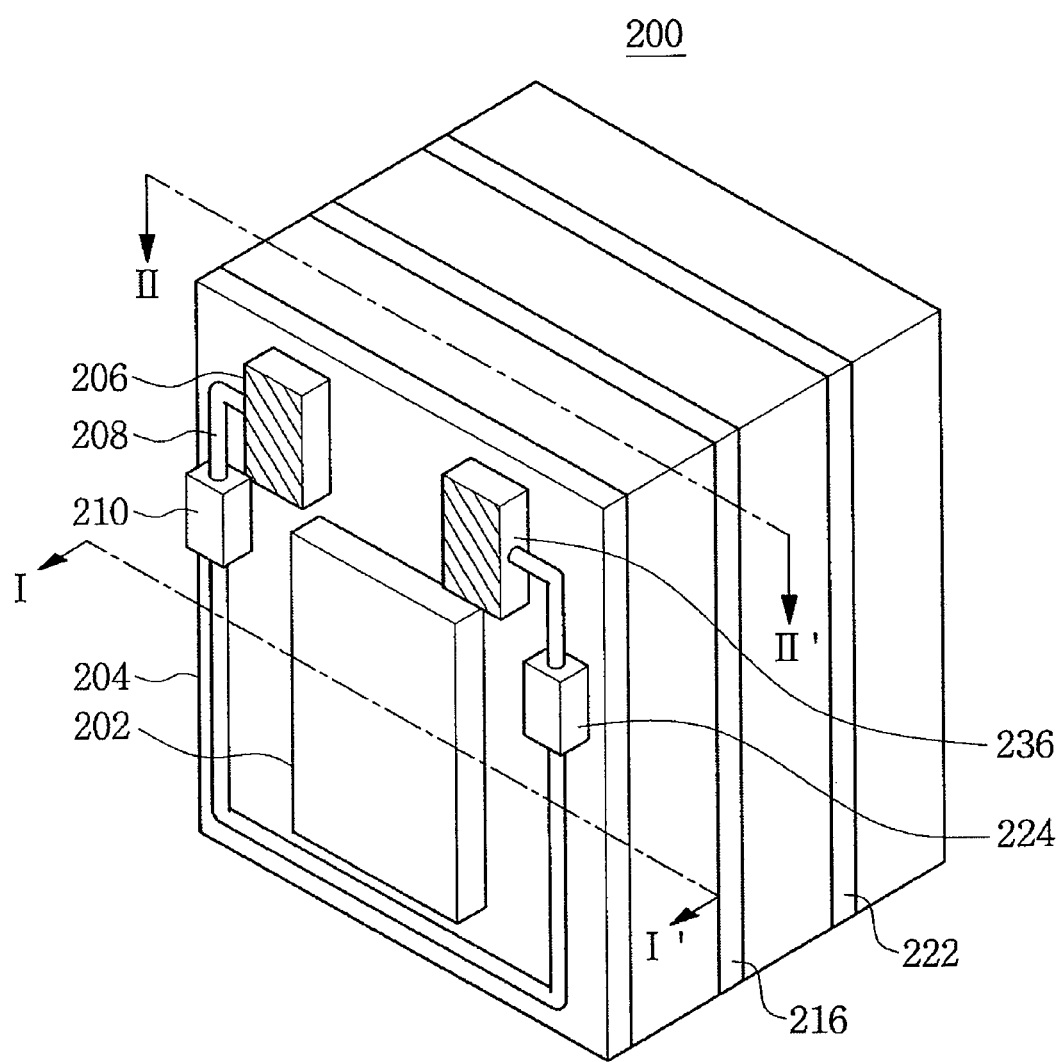
FIG. 7B is a plan view of a semiconductor module employing two ground terminals and two switching elements according to an aspect of the second illustrative embodiment.
Figure 7C:
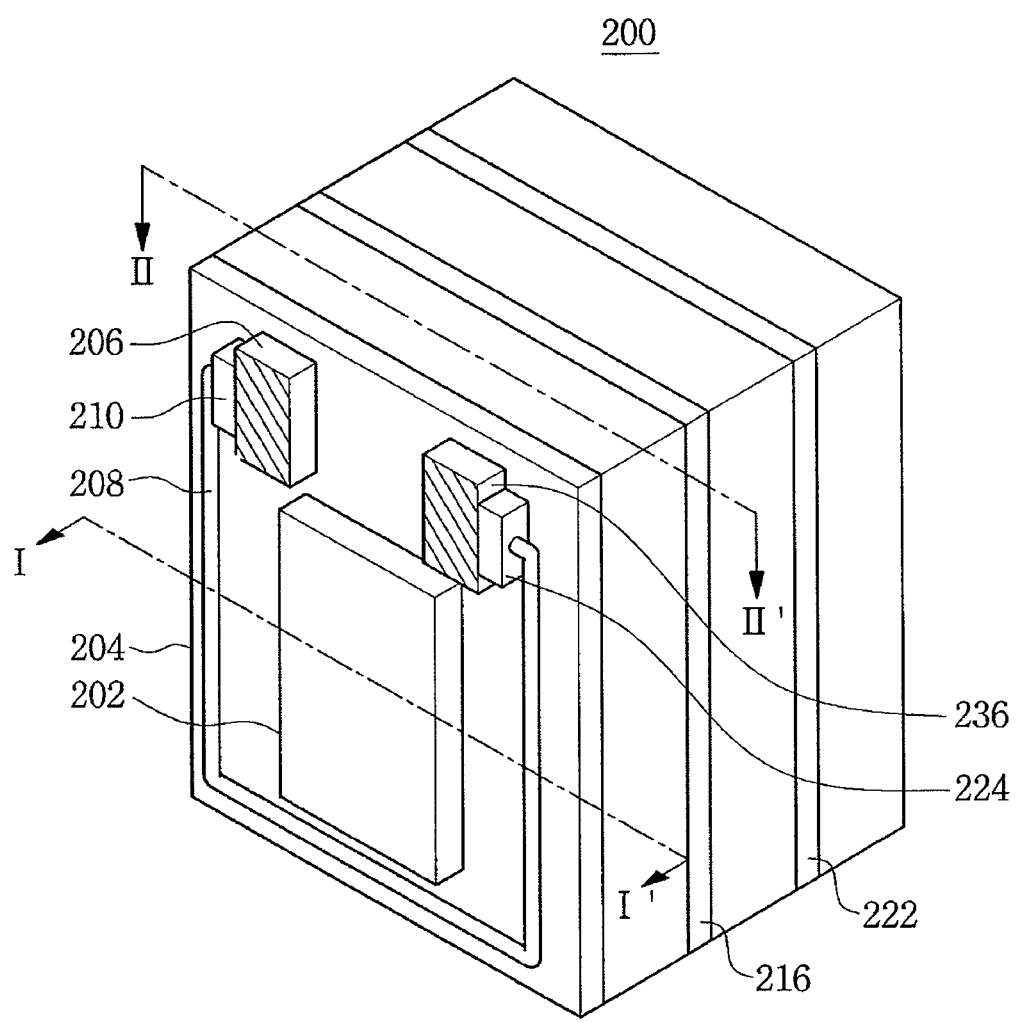
FIG. 7C is a plan view of a semiconductor module employing two switching elements formed adjacent to the ground terminals according to another aspect of the second illustrative embodiment.
Figure 8:
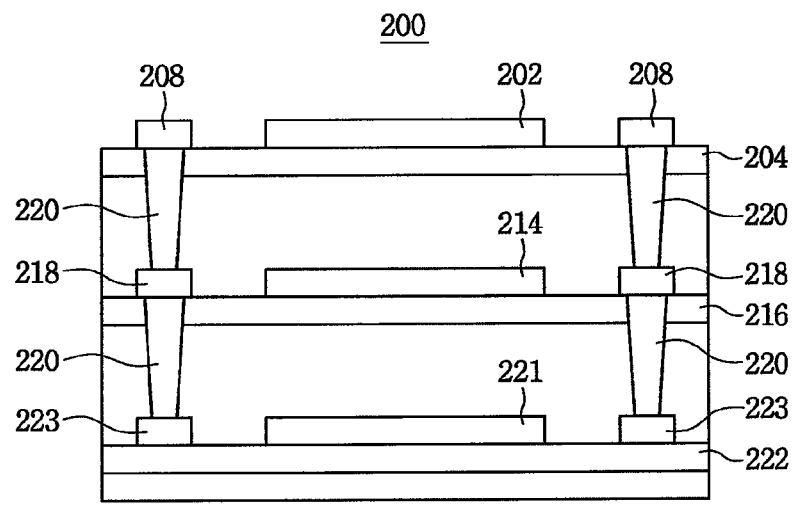
FIG. 8 is a cross-sectional view of a semiconductor module along line I-I' of FIG. 7B.
Figure 9:
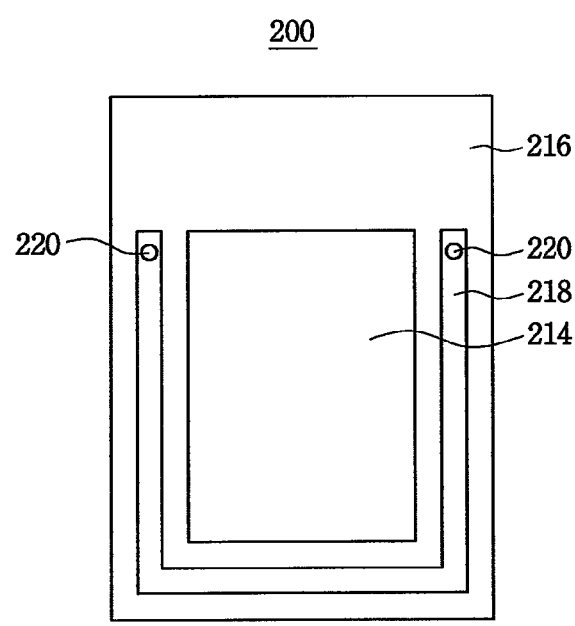
FIG. 9 is a cross-sectional view of a semiconductor module along line II-II' of FIG. 7B.

FIG. 7A is a plan view of a semiconductor module according to a second illustrative embodiment. FIG. 7B is a plan view of a semiconductor module employing two ground terminals and two switching elements according to an aspect of the second illustrative embodiment. FIG. 7C is a plan view of a semiconductor module employing two switching elements formed adjacent to the ground terminals according to another aspect of the second illustrative embodiment. FIG. 8 is a cross-sectional view of a semiconductor module along line I-I' of FIG. 7B. FIG. 9 is a cross-sectional view of a semiconductor module along line II-II' of FIG. 7B.

Referring to FIGS. 7A, 7B, 7C, 8 and 9, the semiconductor module 200 includes a plurality of substrates 204, 216 and 222 on which respective semiconductor devices 202, 214 and 221 are mounted, a ground terminal 206, first, second and third protection patterns 208, 218 and 223, a switching element 210, and a via pattern 220.

Each of the substrates 204, 216 and 222 may be a printed circuit board or a flexible printed circuit board. In this illustrative embodiment, the substrates 204, 216 and 222 may have a multilayer structure. The substrate located on the uppermost layer is referred to as the first substrate 204, and the substrate located under the first substrate 204 is referred to as the second substrate 216. Although not described and illustrated in detail, the other substrates located under the second substrate 216, such as substrate 222, may have a structure similar to that of the second substrate 216, and be electrically connected with the second substrate 216.

According to an illustrative embodiment, an insulating pattern may be formed between the substrates 204 and 216. The insulating pattern includes an insulator. The insulator may be of silicon oxide, silicon nitride, or silicon oxynitride, for example.

According to another illustrative embodiment, the substrate 204 may be spaced apart from the substrate 216 by a predetermined distance, so that an empty space may be defined between the substrates 204 and 216. Here, a support may be formed on an edge of each of the substrates 204 and 216, thereby separating and supporting each of the substrates 204 and 216.

The first substrate 204 may be divided into a first, a second and a third region (not shown). The first region refers to a region in which the first semiconductor device 202 is mounted. The second region refers to a region in which the ground terminal 106 is installed. The third region refers to a region in which both the first protection pattern 208 configured to protect the semiconductor device 202 and the switching element 210 are installed. For example, the first region may be a central region of the first substrate 204, and the second region may be a region on one side of the central region. Finally, the third region may be a region around the first region except the second region.

The second substrate 216 includes a fourth region and a fifth region (not shown). The fourth region refers to a region in which the second semiconductor device 214 is mounted, and the fifth region refers to a region in which the second protection pattern 218 configured to protect the second semiconductor device 214 is installed. For example, the fourth region may be a central region of the second substrate 216, and the fifth region may be a region around the fourth region.

Each of the first and second semiconductor devices 202 and 214 may include a memory chip. The memory chip may include a volatile memory chip or a non-volatile memory chip.

The ground terminal 206 is formed on the first substrate 204, as shown in FIG. 7A. The ground terminal 206 may be connected to an external ground at one end thereof (not shown), and to the first protection pattern 208 at the other end thereof. The ground terminal 206 may be directly connected to the ground or the first protection pattern 208, or be indirectly connected to the ground or the first protection pattern 208 by a conductive pattern.

According to this illustrative embodiment, two ground terminals 206 and 236 may be formed, as shown in FIG. 7B. The opposite ends of the first protection pattern 208 may be connected with the respective ground terminals 206 and 236. Although this example embodiment uses the two ground terminals 206 and 236, the number of the ground terminals is not limited to two.

The first protection pattern 208 is formed in the second region of the first substrate 204, and is spaced apart from the first semiconductor device 202 by a predetermined distance. Further, the first protection pattern 208 is connected to the ground terminals 206 and 236. In this illustrative embodiment, when the number of the ground terminals is two, the opposite ends of the first protection pattern 208 may be connected with the respective ground terminals 206 and 236, and thus the first protection pattern 208 may have the shape of a loop that surrounds the first semiconductor device 202.

The switching element 210 connects the first protection pattern 208 and the ground terminal 206 in series. According to an illustrative embodiment, the switching element 210 may be installed in the first protection pattern 208, as shown in FIG. 7A. According to another illustrative embodiment, the switching element 210 may be directly connected with the ground terminal 206.

In this illustrative embodiment, two switching elements 210 and 224 may be formed. The switching elements 210 and 224 connect the ground terminals 206 and 236 to the opposite ends of the first protection pattern 208, respectively. Although this example embodiment uses the two switching elements 210 and 224, the number of the switching elements is not limited to two.

Further, the switching element 210 may be formed adjacent to the ground terminal 206, as shown in FIG. 7C. This configuration allows a distance between the switching element 210 and the ground terminal 206 to be minimized. Thereby, when a spark is triggered under a high voltage as in an ESD, a high-voltage current may rapidly flow to the ground terminal 206 through the first protection pattern 208.

The switching element 210 may include one of a Zener diode, an inductor, and a varistor. The Zener diode, the inductor, and the varistor have the same structure as described with reference to FIGS. 1A, 1B, 1C and 2 through 6 of the first illustrative embodiment, and the description thereof will be omitted.

The second protection pattern 218 is provided in the fifth region of the second substrate 216, and is spaced apart from the second semiconductor device 214 by a predetermined distance. The second protection pattern 218 is electrically connected with the first protection pattern 208. In this illustrative embodiment, the second protection pattern 218 may be connected with the first protection pattern 208 by the via pattern 220. Particularly, the via pattern 220 may be formed adjacent to the switching element 210, and may be electrically connected to the loop region of the first protection pattern 208.

The second protection pattern 218 may be formed of a conductor. The conductor may include a metal or a metallic compound. The conductor may be copper or a copper compound, for example. Further, the second protection pattern 218 may be formed of substantially the same material as the first protection pattern 208 or of a material different from the material of the first protection pattern 208.

The via pattern 220 may be formed of a conductor. The conductor may include a metal or a metallic compound. The conductor may be copper or a copper compound, for example. Further, the via pattern 220 may be formed of substantially the same material as the second protection pattern 218 or of a material different from the material of the second protection pattern 218.

The principle of operating the semiconductor module 200 depending on an applied voltage according to this illustrative embodiment will be described below.

A predetermined voltage is applied to the semiconductor module 200. When the applied voltage is within a set voltage range, the switching element 210 formed on the first substrate 204 has a high value of resistance, and thus becomes substantially an off state. Thus, the first and second protection patterns 208 and 218 are electrically disconnected from the ground terminal 206, and thus the first and second protection patterns 208 and 218 become an open circuit state.

The set voltage range may be an operating voltage range. As such, products employing the semiconductor module 200 may have different set voltage ranges. For example, when the semiconductor module 200 is applied to an SSD, the set voltage range may range from −12 V to +12 V.

When the voltage applied to the semiconductor module 200 is beyond the set voltage range, the switching element 210 has a very low value of resistance, and thus becomes substantially an ON state. Thus, the first and second protection patterns 208 and 218 are electrically connected with the ground terminal 206, and thus become a closed circuit state. In other words, the first and second protection patterns 208 and 218 are electrically connected with the ground terminal 206 by the switching element 210.

When the voltage is beyond the set voltage range, it may be the case that a high voltage is applied from the outside as in the ESD. In this case, the first and second protection patterns 208 and 218 may be electrically connected with the ground terminal 206, so that a current of the high voltage can flow to the ground through the ground terminal 206. Thus, the first and second semiconductor devices 202 and 214 may be protected from the ESD.

Further, the protection patterns 208 and 218 are provided to the respective substrates 204 and 216, and are electrically connected to each other. Thereby, in the case of an ESD, the semiconductor devices 202 and 214 mounted on the respective substrates 202 and 216 may be more effectively protected from the ESD.

Third Illustrative Embodiment

Figure 10A:
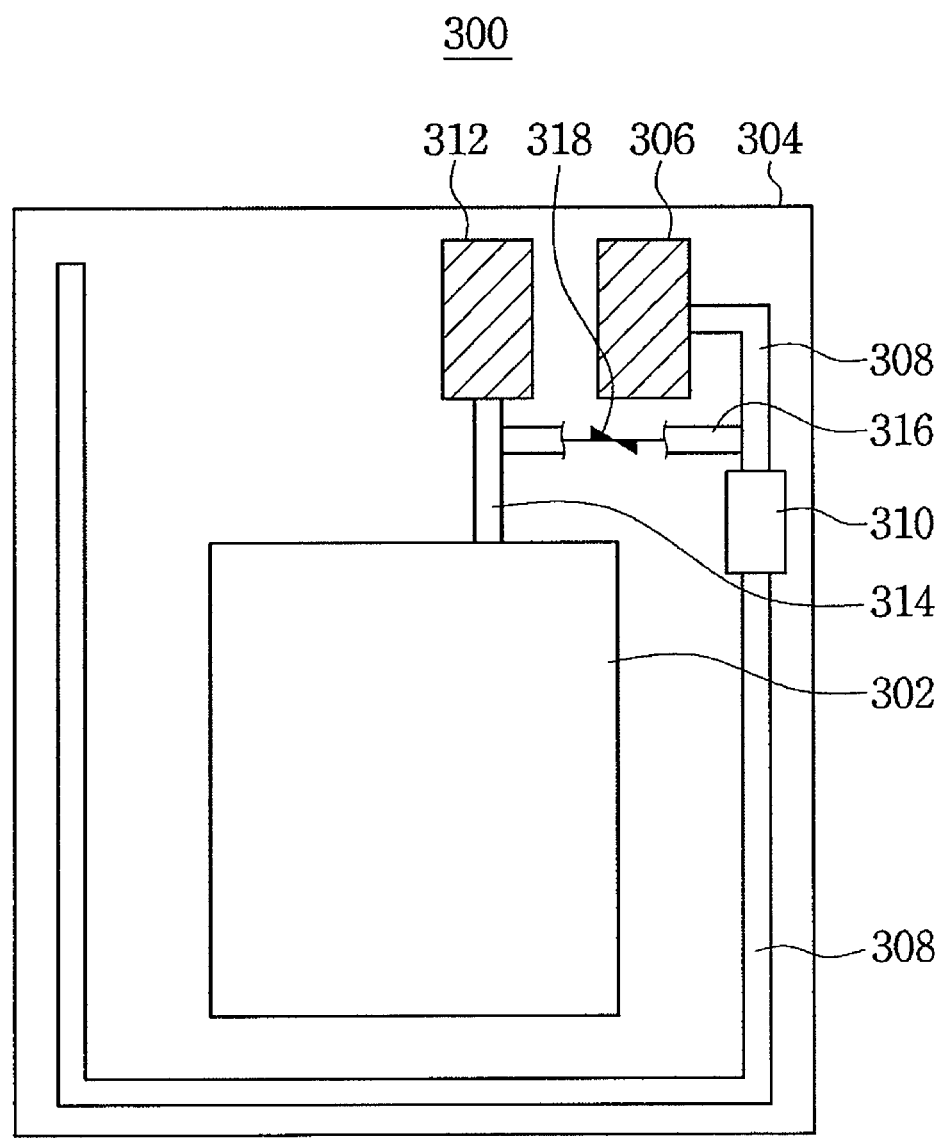
FIG. 10A is a plan view of a semiconductor module according to a third illustrative embodiment.
Figure 10B:
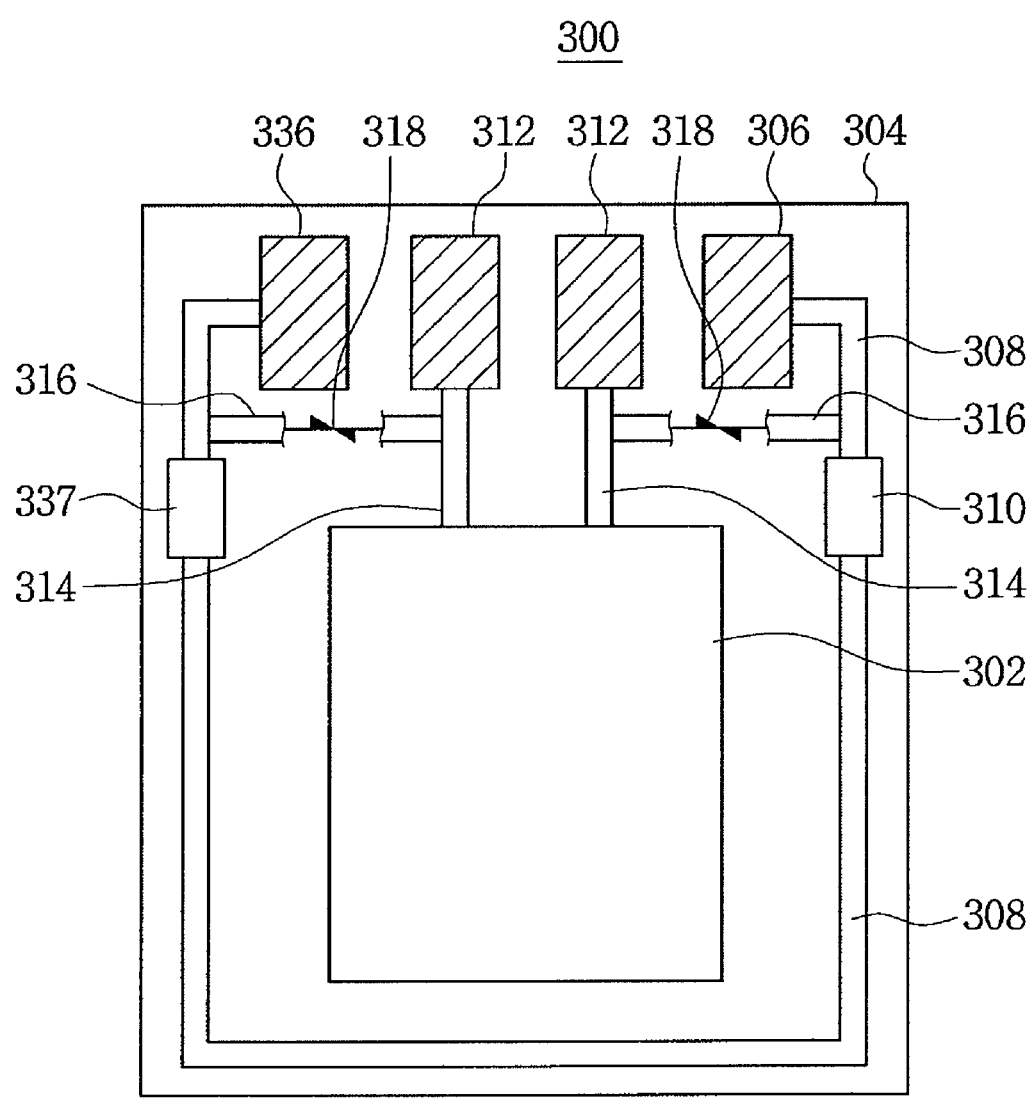
FIG. 10B is a plan view of a semiconductor module employing two ground terminals and two switching elements according to an aspect of the third illustrative embodiment.
Figure 10C:
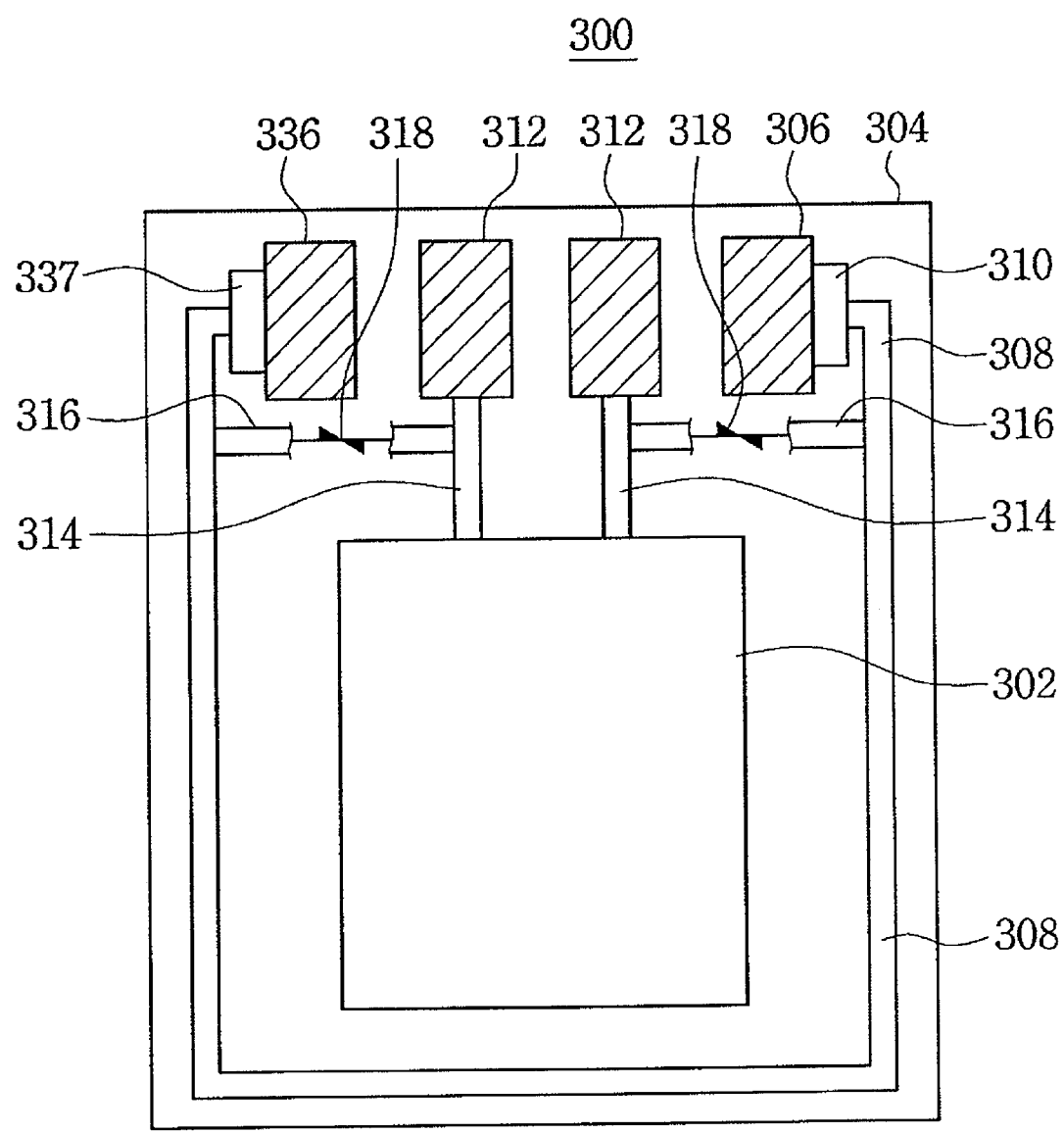
FIG. 10C is a plan view of a semiconductor module employing two switching elements formed adjacent to the ground terminals according to another aspect of the third illustrative embodiment.

FIG. 10A is a plan view of a semiconductor module according to a third illustrative embodiment. FIG. 10B is a plan view of a semiconductor module employing two ground terminals and two switching elements according to an aspect of the third illustrative embodiment. FIG. 10C is a plan view of a semiconductor module two switching elements formed adjacent to the ground terminals according to another aspect of the third illustrative embodiment.

Referring to FIG. 10A, the semiconductor module 300 includes a substrate 304 on which a semiconductor device 302 is mounted, a ground terminal 306, an external connection terminal 312, a protection pattern 308, a first switching element 310, and a second switching element 318.

The substrate 304 may be a printed circuit board or a flexible printed circuit board. Further, the substrate 304 may have a single layer structure or a multilayer structure.

The substrate 304 may be divided into a first, a second and a third region (not shown). The first region refers to a region in which the semiconductor device 302 is mounted. The second region refers to a region in which the ground terminal 306 and the external connection terminal 312 are installed. The third region refers to a region in which the protection pattern 308, which is configured to protect the semiconductor device 302, is installed. For example, the first region may be a central region of the substrate 304, and the second region may be a region on one side of the central region. Finally, the third region may be a region around the first region except the second region.

The semiconductor device 302 may include a memory chip. The memory chip may include a volatile memory chip and a non-volatile memory chip.

The ground terminal 306 is connected to an external ground at one end thereof, and to the protection pattern 308 at the other end thereof. The ground terminal 306 may be directly connected to the ground or to the protection pattern 308. The ground terminal 306 may also be indirectly connected to the ground or the protection pattern 308 by a conductive pattern.

According to this illustrative embodiment, two ground terminals 306 and 336 may be formed, as shown in FIG. 10B. The opposite ends of the protection pattern 308 may be connected with the respective ground terminals 306 and 336. Although this illustrative embodiment uses the two ground terminals 306 and 336, the number of the ground terminals is not limited to two.

The external connection terminal 312 is installed between the two ground terminals 306 and 336. The external connection terminal 312 is electrically connected with the semiconductor device 302 by a first connection pattern 314. The external connection terminal 312 and the first connection pattern 314 may be formed of a conductor. The conductor may include a metal or a metallic compound, for example copper or a copper compound.

The protection pattern 308 is formed in the second region of the substrate 304, and is spaced apart from the semiconductor device 302 by a predetermined distance. Further, the protection pattern 308 is connected to the ground terminals 306 and 336. In this illustrative embodiment, the opposite ends of the protection pattern 308 may be connected with the respective ground terminals 306 and 336, and thus the protection pattern 308 may have the shape of a loop that surrounds the semiconductor device 302.

The first switching element 310 connects the protection pattern 308 and the ground terminal 306 in series. According to an illustrative embodiment, the first switching element 310 may be installed in the protection pattern 308. According to another illustrative embodiment, the first switching element 310 may be directly connected with the ground terminal 306.

In this illustrative embodiment, two first switching elements 310 and 337 may be formed. The first switching elements 310 and 337 connect the ground terminals 306 and 336 to the opposite ends of the protection pattern 308, respectively. Although this illustrative embodiment uses the two first switching elements 310 and 337, the number of first switching elements is not limited to two.

Further, the first switching elements 310 and 337 may be formed adjacent to the ground terminals 306 and 336, as shown in FIG. 10C. This configuration allows a distance between the first switching element 310 and the ground terminal 306 and between the first switching element 337 and the ground terminal 336 to be minimized. Thereby, when a spark is triggered under high voltage as in an ESD, a high-voltage current may rapidly flow to the ground terminal 306 through the protection pattern 308.

The first switching element 310 may include one of a Zener diode, an inductor, and a varistor. The Zener diode, the inductor, and the varistor have the same structure as described with reference to FIGS. 1 through 6 of the first illustrative embodiment, and the description thereof will be omitted.

The second switching element 318 connects the first connection pattern 314 with the protection pattern 308. For example, the first connection pattern 314 and the protection pattern 308 may be connected by a second connection pattern 316. According to an illustrative embodiment, the second switching element 318 may be installed in the second connection pattern 316. In another illustrative embodiment, the second switching element 318 may be directly connected with the ground terminal 306. The second switching element 318 includes a varistor. The varistor has the same structure as the structure described with reference to FIGS. 4 and 5 of the first illustrative embodiment, and the description thereof will be omitted.

The principle of operating the semiconductor module 300 depending on an applied voltage will be described below.

When a voltage is applied to the semiconductor module 300 within a set voltage range, the first and second switching elements 310 and 318 have a high value of resistance, and thus become an off state. Thus, the protection pattern 308 and the second connection pattern 316 are electrically disconnected from the ground terminal 306, and thus the protection pattern 308 and the second connection pattern 316 become an open circuit state.

The set voltage range may be an operating voltage range. In other words, products employing the semiconductor module 300 may have different set voltage ranges. For example, when the semiconductor module 300 is applied to an SSD, the set voltage range may range from −12 V to +12 V.

The protection pattern 308 becomes the open circuit state within the set voltage range, so that the protection pattern 308 may be less susceptible to a loop antenna effect caused by a loop shape. Since the loop antenna effect is inhibited, the protection pattern 308 may be less affected by EMI. Further, since the protection pattern 308 becomes the open circuit state, a return path of a signal applied to the substrate 304 becomes short, so that it is possible to inhibit generation of noise resulting from a long return path.

When the voltage applied to the substrate 304 is beyond the set voltage range, the first and second switching elements 310 and 318 have a very low value of resistance, and thus become an ON state. Thus, the protection pattern 308 and the second connection pattern 316 are electrically connected with the ground terminal 306, and thus become a short circuit state. In other words, the protection pattern 308 and the second connection pattern 316 are electrically connected with the ground terminal 306 by the first and second switching elements 310 and 318.

When the voltage is beyond the set voltage range it may be the case that a high voltage is applied from the outside as in the ESD. In this case, the protection pattern 308 may be electrically connected with the ground terminal 306 by the first switching element 310, so that a current related to the high voltage can flow to the ground through the ground terminal 306. Thus, the semiconductor device 302 may be protected from the ESD.

Further, the second connection pattern 316 is electrically connected with the protection pattern 308 by the second switch element 318, and the protection pattern 308 is connected with the ground terminal 306, so that the semiconductor device 302 can be more effectively protected from the ESD.

Fourth Illustrative Embodiment

Figure 11A:
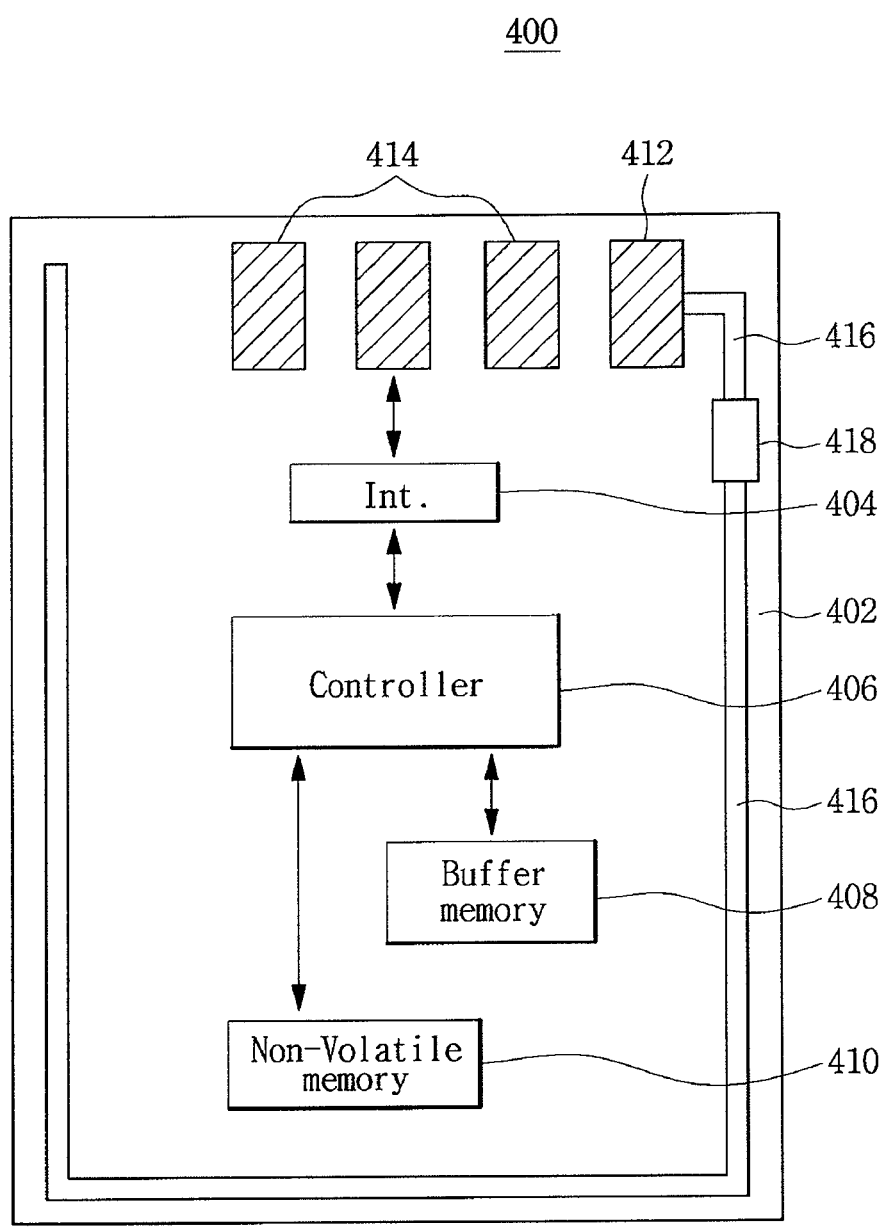
FIG. 11A is a plan view of a data memory module including a semiconductor module, according to a fourth illustrative embodiment.
Figure 11B:
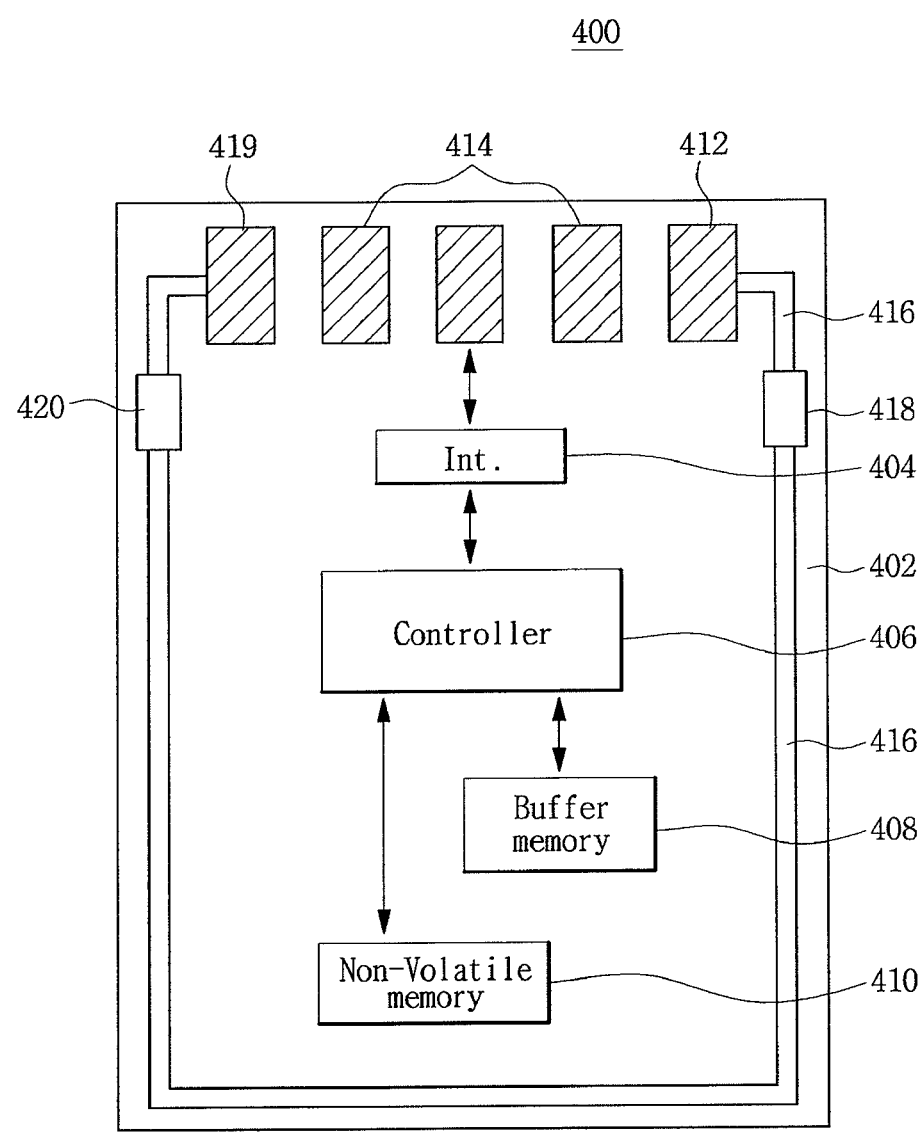
FIG. 11B is a plan view of a data memory module including a semiconductor module employing two ground terminals and two switching elements according to an aspect of the fourth illustrative embodiment.
Figure 11C:
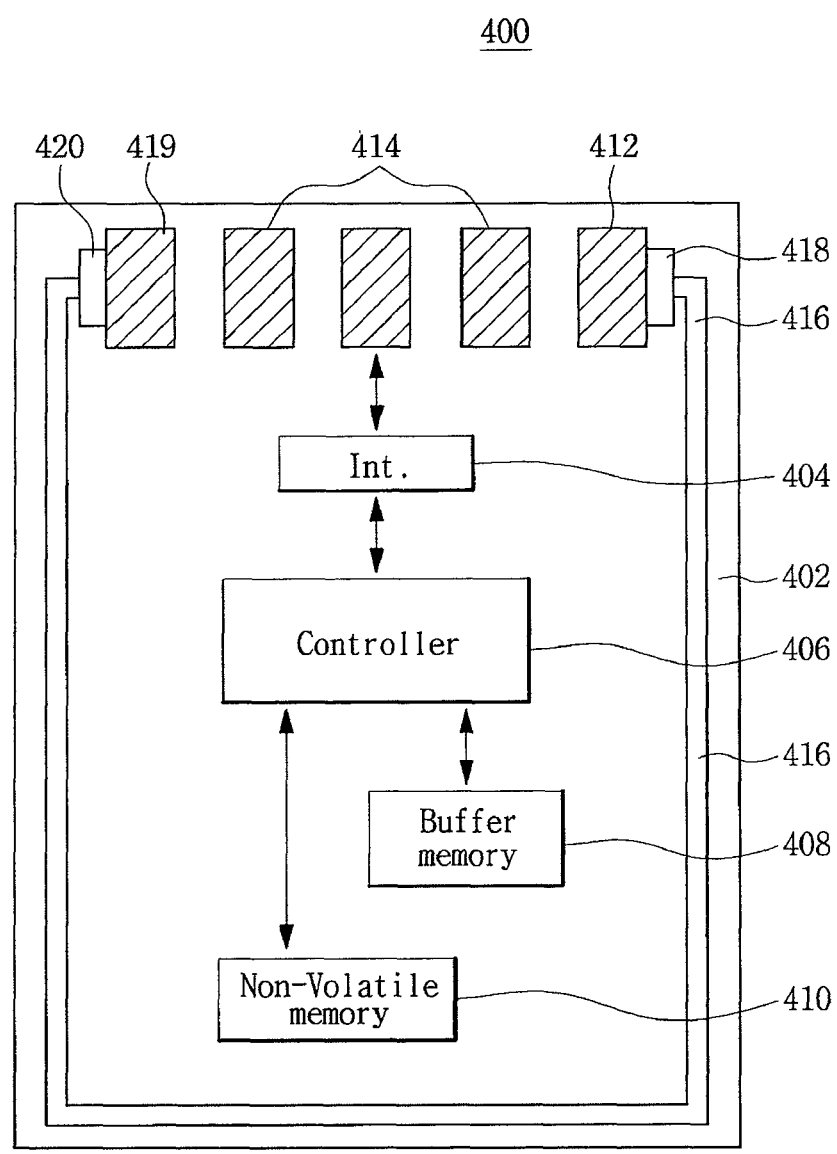
FIG. 11C is a plan view of a data memory module including a semiconductor module employing two switching elements formed adjacent to the ground terminals according to another aspect of the fourth illustrative embodiment.

FIG. 11A is a plan view of a data memory module including a semiconductor module according to a fourth illustrative embodiment. FIG. 11B is a plan view of a data memory module including a semiconductor module employing two ground terminals and two switching elements according to an aspect of the fourth illustrative embodiment. FIG. 11C is a plan view of a data memory module including a semiconductor module employing two switching elements formed adjacent to the ground terminals according to another aspect of the fourth illustrative embodiment.

Referring to FIG. 11A, the data memory module 400 includes a substrate 402, an interface 404, a controller 406, a buffer memory 408, a memory chip 410, a ground terminal 412, an external connection terminals 414, a protection pattern 416, and a switching element 418.

In this illustrative embodiment, the data memory module 400 employs an SSD. The SSD is a device that stores information using a semiconductor. The SSD has a rapid speed, a low mechanical delay, a low failure rate, low heat radiation, and low noise, and a capability of reducing a size and a weight, compared to a hard disk drive (HDD). The SSD may be used for a laptop computer, a desktop computer, an MP3 player, or a portable memory device.

The substrate 402 may be a printed circuit board or a flexible printed circuit board. Further, the substrate 402 may have a single layer structure or a multilayer structure.

The substrate 402 may be divided into a first, a second and a third region (not shown). The first region refers to a region in which the interface 404, controller 406, buffer memory 408, and memory chip 410 are mounted. The second region refers to a region in which the ground terminal 412 and external connection terminals 414 are installed. The third region refers to a region in which the protection pattern 416, which is configured to protect the first region, is e installed. For example, the first region may be a central region of the substrate 402, and the second region may be a region on one side of the central region. Finally, the third region may be a region around the first region except the second region.

The interface 404 may electrically connect a host and the controller 406 through the external connection terminals 414. The interface 404 may function to convert electrical signals, such as data signals, between the host and the controller 406, and transceive the data in opposite directions. The interface 404 may be a device that uses a standard, such as, Advanced Technology Attachment (ATA), Serial ATA (SATA), Integrated Drive Electronics (IDE), Small Computer System Interface (SCSI), Fibre Channel (FC), or a combination thereof.

The controller 406 may function to control the data transferred from the interface 404 and to transfer and store the data in the memory chip 410 or in the buffer memory 408.

Although not illustrated in detail, the controller 406 may be electrically connected with an error controller. The error controller may detect and correct an error which occurs when the signals are converted by the interface 404. The error controller may include Error Detection Code (EDC) and Error Correction Code (ECC).

When data are transferred and received between the controller 406 and the memory chip 410, a difference in transfer speed and time may occur between the controller 406 and the memory chip 410. In this case, in order to eliminate the difference in transfer speed and time, the data is temporarily stored in buffer memory 408. The buffer memory 408 may include a volatile memory. As the volatile memory, DRAM or SRAM may be used. The volatile memory shows a relatively rapid operating speed compared to a non-volatile memory.

In this illustrative embodiment, when the memory chip 410 is a NAND flash memory, the data processing speed of the interface 404 is faster than an operating speed of the NAND flash memory. Thus, the data, received through the interface 404, may be temporarily stored in the buffer memory 408 via the controller 406. Thereby, the buffer memory 408 may increase an operating speed of the data memory module 400, and may reduce an error rate.

The memory chip 410 permanently stores the data received through the interface 404. In detail, the data received through the interface 404 may be temporarily stored in the buffer memory 408, and thereafter may be permanently stored in the memory chip 410 in synchronization with a data recording speed of the memory chip 410. The memory chip 410 may include a non-volatile memory. The non-volatile memory may be a NAND flash memory or a NOR flash memory, for example. In the case of the NAND flash memory, the memory chip may have a single level cell structure or a multi-level cell structure.

The ground terminal 412 may be connected to an external ground at one end thereof, and to the protection pattern 416 at the other end thereof. According to this illustrative embodiment, two ground terminals 412 and 419 may be formed, as shown in FIG. 11B. The opposite ends of the protection pattern 416 may be connected with the respective ground terminals 412 and 419.

The external connection terminals 414 are installed between the two ground terminals 412 and 419. The external connection terminals 414 are electrically connected with the interface 404 by a connection pattern (not shown).

The protection pattern 416 is formed in the second region of the substrate 402, and is spaced apart from the semiconductor device by a predetermined distance. The protection pattern 416 is connected to the ground terminals 412 and 419. In this illustrative embodiment, when the number of the ground terminals is two, the opposite ends of the protection pattern 416 may be connected with the respective ground terminals 412 and 419, and thus the protection pattern 416 may have the shape of a loop that surrounds the first region of the substrate.

The switching element 418 connects the ground terminal 412 and the protection pattern 416 in series. According to an illustrative embodiment, the switching element 418 may be installed in the protection pattern 416. According to this illustrative embodiment, the switching element 418 may be directly connected with the ground terminal 412.

Further, the switching element 418 may be formed adjacent to the ground terminal 412, as shown in FIG. 11C. This configuration allows a distance between the switching element 418 and the ground terminal 412 to be minimized. Thereby, when a spark is triggered under a high voltage as in an ESD, a current of the high voltage may rapidly flow to the ground terminal 412 through the protection pattern 416.

The switching element 418 may include one of a Zener diode, an inductor, and a varistor. The Zener diode, the inductor, and the varistor have the same structure as described with reference to FIGS. 1 through 6 of the first illustrative embodiment, and the description thereof will be omitted.

In one illustrative embodiment, the substrate 402, the ground terminal 412, the protection pattern 416, and the switching element 418, which make up the data memory module 400 of this illustrative embodiment, are similar to those described with reference to FIGS. 1A, 1B, 1C and 2 through 6 of the first example embodiment, and the description thereof will be omitted.

In another illustrative embodiment, the data memory module 400 further includes a second protection pattern and a via pattern. In this case, the second protection pattern and the via pattern in addition to the substrate 402, the ground terminal 412, the protection pattern 416, and the switching element 418 which make up the data memory module 400 of this illustrative embodiment are similar to those described with reference to FIGS. 7A, 7B, 7C 8 and 9 of the second illustrative embodiment, and the description thereof will be omitted.

According to yet another aspect of this illustrative embodiment, the data memory module 400 further includes a second connection pattern and a second switching element 420. In this case, the second connection pattern and the second switching element 420 in addition to the substrate 402, the ground terminal 412, the protection pattern 416, and the switching element 418 which make up the data memory module 400 of this illustrative embodiment are similar to those described with reference to FIG. 10 of the third illustrative embodiment, and the description thereof will be omitted.

According to the illustrative embodiments, a semiconductor module includes a protection pattern connected with a ground terminal, and a switching element. Further, a data memory module employs the semiconductor module. Thus, only when the voltage applied to a substrate is beyond a set voltage range, the protection pattern is electrically connected with the ground terminal, so that the semiconductor device can be effectively protected from ESD.

The foregoing is representative of illustrative embodiments and is not to be construed as limiting such embodiments. Although a few illustrative embodiments have been described, those skilled in the art will readily appreciate that many modifications are possible in the illustrative embodiments without materially departing from the novel teachings and advantages. For example, the example embodiments may be applied to a semiconductor module having a volatile memory, such as a DRAM or an SRAM, and a data memory module having the same. Accordingly, all such modifications are intended to be included within the scope of this inventive concept as defined in the appended claims. In the claims, means-plus-function clauses are intended to cover the structures described herein as performing the recited function, and not only structural equivalents but also equivalent structures. Therefore, it is to be understood that the foregoing is representative of various illustrative embodiments and is not to be construed as limiting the specific illustrative embodiments disclosed, and that modifications to the disclosed illustrative embodiments, as well as other embodiments, are intended to be included within the scope of the appended claims.

What is claimed is:

1. A semiconductor module, comprising:
a first substrate having a first semiconductor device;
a first ground terminal formed on the first substrate;
a first protection pattern formed on the first substrate; and
a first switching element placed in series between the first ground terminal and the first protection pattern,
wherein the first switching element electrically connects the first protection pattern with the first ground terminal when a voltage applied to the first substrate is beyond a set voltage range;
wherein the first protection pattern is in the form of loop that surrounds the first semiconductor device on at least three sides.

2. The semiconductor module according to claim 1, further comprising:
a second ground terminal formed on the first substrate; and
a second switching element placed in series between the second ground terminal and the first protection pattern,
wherein the first ground terminal and the second ground terminal are provided on one side of the first substrate.

3. The semiconductor module according to claim 2, wherein the first switching element is formed adjacent to the first ground terminal, and
wherein the second switching element is formed adjacent to the second ground terminal.

4. The semiconductor module according to claim 2, wherein the first protection pattern is configured such that opposite ends of the first protection pattern are connected through the first switching element to the first ground terminal and through the second switching element to the second ground terminal, and
wherein the first protection pattern is formed along an edge of the first substrate.

5. The semiconductor module according to claim 1, wherein the first switching element includes one of a varistor, a Zener diode and an inductor.

6. The semiconductor module according to claim 1, wherein the first switching element comprises a varistor, and
wherein a resistor comprising a high value of resistance is inserted into the first protection pattern adjacent to the varistor.

7. The semiconductor module according to claim 1, wherein the first switching element electrically disconnects the first protection pattern from the first ground terminal when the voltage applied to the first substrate is within the set voltage range.

8. The semiconductor module according to claim 1, further comprising:
a second substrate located under the first substrate and having a second semiconductor device;
a second protection pattern formed on the second substrate; and
a via pattern configured to electrically connect the second protection pattern with the first protection pattern.

9. The semiconductor module according to claim 1, further comprising:

an external connection terminal formed on the first substrate;

a connection pattern configured to electrically connect the external connection terminal with the first semiconductor device; and a varistor configured to connect the connection pattern with the first ground terminal, wherein the varistor electrically connects the connection pattern with the first ground terminal when the voltage applied to the first substrate is beyond the set voltage range.

10. A data memory module, comprising:

a substrate having a memory chip;

a ground terminal formed on the substrate;

a protection pattern formed on the substrate; and a switching element placed in series between the protection pattern and the ground terminal, wherein the switching element electrically connects the protection pattern with the ground terminal when a voltage applied to the substrate is beyond a set voltage range;

wherein the protection pattern is in the form of a loop that surrounds the memory chip on at least three sides.

11. The data memory module according to claim 10, wherein the switching element includes one of a varistor, a Zener diode, and an inductor.

12. The data memory module according to claim 10, further comprising:

an external connection terminal formed on the substrate;

an interface electrically connected with the external connection terminal and configured to transceive data;

a controller configured to electrically connect the memory chip with the interface; and a buffer memory electrically connected with the controller and configured to temporarily store the data.

* * * * *